(12) United States Patent
Maxik et al.

(10) Patent No.: US 8,835,945 B2
(45) Date of Patent: Sep. 16, 2014

(54) SERIALLY-CONNECTED LIGHT EMITTING DIODES, METHODS OF FORMING SAME, AND LUMINAIRES CONTAINING SAME

(71) Applicant: Lighting Science Group Corporation, Satellite Beach, FL (US)

(72) Inventors: Fredric S. Maxik, Indialantic, FL (US); David E. Bartine, Cocoa, FL (US); Robert R. Soler, Cocoa Beach, FL (US); Theodore Scone, Satellite Beach, FL (US); Mark Andrew Oostdyk, Cape Canaveral, FL (US)

(73) Assignee: Lighting Science Group Corporation, Satellite Beach, FL (US)

( * ) Notice: Subject to any disclaimer, the term of this patent is extended or adjusted under 35 U.S.C. 154(b) by 0 days.

(21) Appl. No.: 13/739,286

(22) Filed: Jan. 11, 2013

(65) Prior Publication Data

US 2014/0197746 A1 Jul. 17, 2014

(51) Int. Cl.
*H01L 29/18* (2006.01)

(52) U.S. Cl.
USPC .......................................................... 257/88

(58) Field of Classification Search
CPC .............. H01L 25/0753; H01L 33/62; H01L 2224/48091; H01L 33/60; H01L 27/15
USPC ............. 257/13, 79–103, E25.032, E51.022
See application file for complete search history.

(56) References Cited

U.S. PATENT DOCUMENTS

| | | | |
|---|---|---|---|
| 6,358,631 B1 * | 3/2002 | Forrest et al. ................. | 428/690 |
| 6,365,270 B2 * | 4/2002 | Forrest et al. ................. | 428/336 |
| 6,548,956 B2 * | 4/2003 | Forrest et al. ................. | 313/504 |
| 7,173,369 B2 * | 2/2007 | Forrest et al. ................. | 313/503 |
| 7,285,801 B2 | 10/2007 | Eliashevich et al. | |
| 7,714,504 B2 * | 5/2010 | Forrest et al. ................. | 313/504 |
| 7,732,803 B2 * | 6/2010 | Shum et al. ..................... | 257/13 |
| 7,884,377 B2 | 2/2011 | Onushkin et al. | |
| 7,910,395 B2 * | 3/2011 | Shei et al. ........................ | 438/88 |
| 8,324,803 B2 * | 12/2012 | Forrest et al. ................. | 313/504 |
| 2001/0000005 A1 * | 3/2001 | Forrest et al. ............. | 204/192.12 |
| 2002/0153243 A1 * | 10/2002 | Forrest et al. ............. | 204/192.26 |
| 2003/0213967 A1 * | 11/2003 | Forrest et al. .................. | 257/96 |
| 2005/0218780 A1 | 10/2005 | Chen | |
| 2007/0132369 A1 * | 6/2007 | Forrest et al. ................. | 313/503 |
| 2008/0211416 A1 | 9/2008 | Negley et al. | |
| 2008/0308819 A1 * | 12/2008 | Louwsma et al. .............. | 257/89 |
| 2009/0179210 A1 * | 7/2009 | Cok ............................... | 257/98 |
| 2010/0187988 A1 * | 7/2010 | Forrest et al. ................. | 313/504 |
| 2011/0006701 A1 * | 1/2011 | Yu et al. ......................... | 315/291 |

(Continued)

FOREIGN PATENT DOCUMENTS

| | | |
|---|---|---|
| WO | WO 2003073518 | 9/2003 |
| WO | WO 2008091837 | 7/2008 |
| WO | WO 2012031533 | 3/2012 |

*Primary Examiner* — Thienvu Tran

(74) *Attorney, Agent, or Firm* — Mark R. Malek; Daniel C. Pierron; Zies Widerman & Malek

(57) ABSTRACT

A method of making a substantially monolithic lighting device comprising serially connected LEDs and lighting systems including the same. The serially connected LEDs may be comprised in a monolithic device comprising a first LED, a layer of conductive material, and a second LED positioned thereupon. The serially connected LEDs may also be electrically coupled to a plurality of resistors obviating the necessity of an AC/DC power converter when a luminaire containing the serially connected LEDs is connected to an AC power source.

10 Claims, 6 Drawing Sheets

(56) References Cited

U.S. PATENT DOCUMENTS

| | | | |
|---|---|---|---|
| 2011/0204376 A1* | 8/2011 | Su et al. | 257/76 |
| 2012/0081922 A1* | 4/2012 | Yeh et al. | 362/612 |
| 2012/0138959 A1* | 6/2012 | Tsang | 257/80 |
| 2012/0168716 A1* | 7/2012 | Chu et al. | 257/13 |
| 2013/0027976 A1* | 1/2013 | Robbins et al. | 362/612 |
| 2013/0248909 A1* | 9/2013 | Kim et al. | 257/98 |
| 2013/0306964 A1* | 11/2013 | Han | 257/43 |
| 2013/0308309 A1* | 11/2013 | Schubert et al. | 362/231 |

* cited by examiner

SERIALLY-CONNECTED LIGHT EMITTING DIODES, METHODS OF FORMING SAME, AND LUMINAIRES CONTAINING SAME

FIELD OF THE INVENTION

The present invention relates to systems and methods for serially-connected lighting devices composed of serially-connected light-emitting diodes (LEDs), methods of making the same, and luminaires that contain the same.

BACKGROUND OF THE INVENTION

The use of light emitting diodes (LEDs) in lighting devices has been consistently confronted with the challenge of generally non-uniform distribution of light emitted by the LEDs. This problem arises from the nature of how LEDs are fabricated, namely the deposition of semiconducting materials on a substrate that obscures or otherwise prevents the propagation of light therethrough. As such, LEDs have tended to emit light only in a hemisphere generally above the substrate. Moreover, the subsequent attachment of LEDs to an opaque circuit board further prevents light from propagating into the hemisphere generally "below" the LED. Attempts to compensate for this problem have included the positioning of multiple LEDs in varying orientations, reflection/refraction of light emitted by the LEDs, and the like. The solution presented below provides a method for fabricating an LED that has a generally omnidirectional light emission profile, or at least substantially greater than a hemispherical light emission profile. The solution presented below also discloses lighting systems and luminaires comprising such fabricated LEDs.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the foregoing in mind, embodiments of the present invention are related to methods of fabricating a lighting device comprising providing a substrate having a surface, forming a first LED on the surface of the substrate, the first LED having a surface, attaching a first layer of conductive material on the surface of the first LED, the conductive material having a surface, forming a second LED on the surface of the conductive material, and removing the substrate.

Other embodiments of the invention are related to luminaires comprising first and second terminals connected to an alternating current power source having a period, a first LED light source electrically coupled to each of the first and second terminals, and a second LED light source electrically coupled to each of the first and second terminals. Furthermore, the first LED light source may comprise a color conversion layer having an emission latency.

Other embodiments of the invention are related to luminaires comprising a base having an electrical connector configured to couple electrically to a power source, an optic attached to the base so as to define an optical chamber, a first and second support carried by the base and positioned within the optical chamber, and a light source comprising a plurality of serially-connected LEDs. The light source may have a positive terminal coupled electrically to the anode of one LED of the plurality of LEDs and a negative terminal coupled electrically to the cathode of another LED of the plurality of LEDs. The first support may be in electrical communication with each of the electrical connector and the positive terminal. Also, the second support may be in electrical communication with each of the electrical connector and the negative terminal.

Other embodiments of the invention are related to lighting systems comprising a first light source having a plurality of serially connected LEDs and a plurality of resistors coupled electrically at one end to a node between a pair of LEDs and at another end to a ground. The first LED of the series may be connected to a triac AC power supply at its anode, and the last LED of the series may be connected to the ground at its cathode. The electrical connection between each pair of LEDs further may comprise a connection to a resistor that is serially connected to the ground. The LEDs may be arranged such the number of LEDs that emit light varies directly with the instantaneous voltage supplied by the AC power supply.

DETAILED DESCRIPTION OF THE PREFERRED EMBODIMENT

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

In this detailed description of the present invention, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present invention.

Figure 1A:
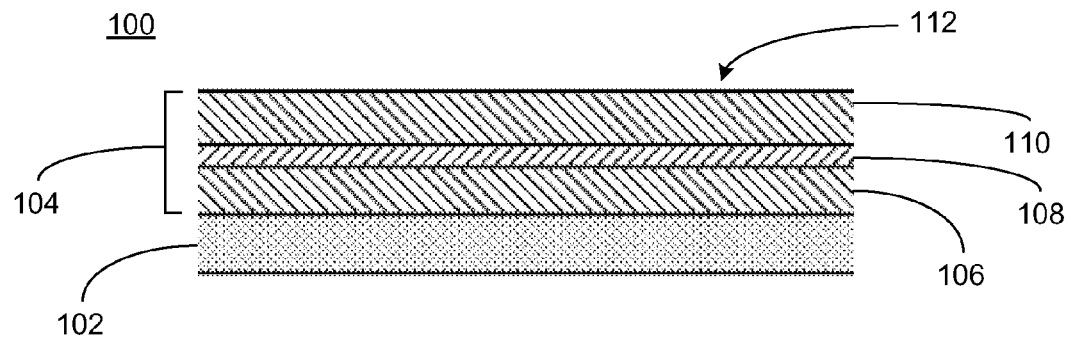
FIG. 1a is a side view of a lighting device die including a first light emitting diode according to an embodiment of the invention.

An embodiment of the invention, as shown and described by the various figures and accompanying text, provides a method of fabricating a lighting device. Referring now to FIG. 1a, a side view of a partially completed lighting device die 100 according to an embodiment of the present invention is presented. The lighting device die 100 may include a substrate 102 and a first light emitting diode (LED) 104. The first LED 104 may be comprised of a first semiconductor layer 106, an active region 108, and a second semiconductor layer 110. The second semiconductor layer 110 may have associated with it a surface 112. The surface 112 may be a top surface. Generally, the surface 112 may be opposite the surface of the second semiconductor layer 110 that forms the active region 108.

In one embodiment, the substrate 102 may comprise sapphire, silicon, silicon carbide, silicon carbide-on-silicon, gallium nitride, gallium nitride-on-sapphire, gallium arsenide, spinel, zinc oxide, and/or indium phosphide. In one embodiment, the first and second semiconductor layers 106, 110 may comprise group-III nitrides and/or group-III arsinides and/or group-III phosphide layers and/or group V hybrides. The aforementioned materials are exemplary only, do not limit the scope of the invention, and other semiconductor materials can also be used for the substrate 112, the first semiconductor layer 106, and the second semiconductor layer 110.

In one manufacturing approach, an epitaxial growth method such as molecular beam epitaxy, vapor phase epitaxy, metalorganic chemical vapor deposition (MOCVD), or similar manufacturing methods may be used in the deposition of each of the first semiconductor layer 106, the active region 108, and the second semiconductor layer 110.

Each of the first semiconductor layer 106 and second semiconductor layer 110 may be doped so as to form a p-n junction with the active region 108 positioned intermediately such that as electrons flow between the first semiconductor layer 106 and the second semiconductor layer 110 the active region 108 may emit photons, hereinafter referred to as light. For example, the first semiconductor layer 106 may be a p-type doped semiconductor material, and the second semiconductor layer 110 may be an n-type dopes semiconductor material, or vice-versa. Moreover, each if the first semiconductor layer 106 and the second semiconductor layer 110 may be comprised of a single layer of deposited material, a plurality of layers of the same or similar material, or a plurality of layers of varying materials.

Figure 1B:
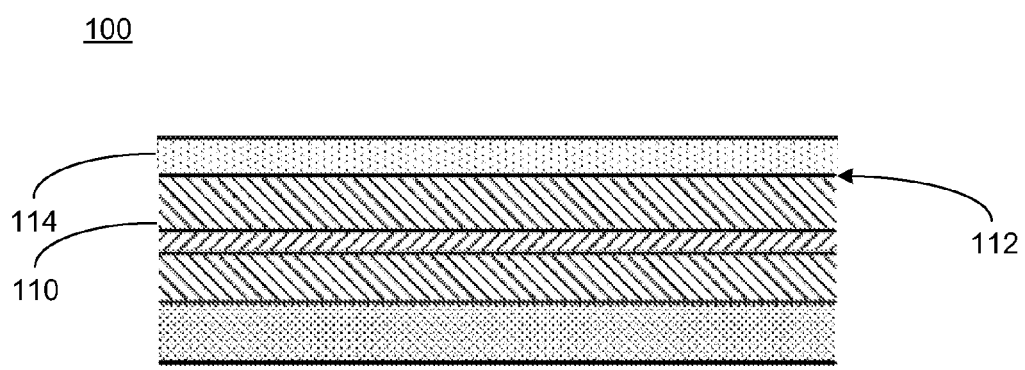
FIG. 1b is a side view of the lighting device die of FIG. 1a further including a conductive layer.

Referring now to FIG. 1b, the lighting die 100 of FIG. 1a is depicted having a layer of conductive material 114 positioned on the surface 112 of the second semiconductor layer 110. The layer of conductive material 114 may positioned on the surface 112 by any appropriate means or methods, including, but not limited to, ink jet deposition. The layer of conductive material 114 may be generally coextensive with the second semiconductor layer 110, may extend beyond the periphery of the second semiconductor layer 110, or may be within the periphery of the second semiconductor layer 110. The thickness of the layer of conductive material 114 may be uniform or may vary. The layer of conductive material 114 may be attached to the surface 112 of the second semiconductor layer 110 so as to prevent relative movement therebetween.

Figure 1C:
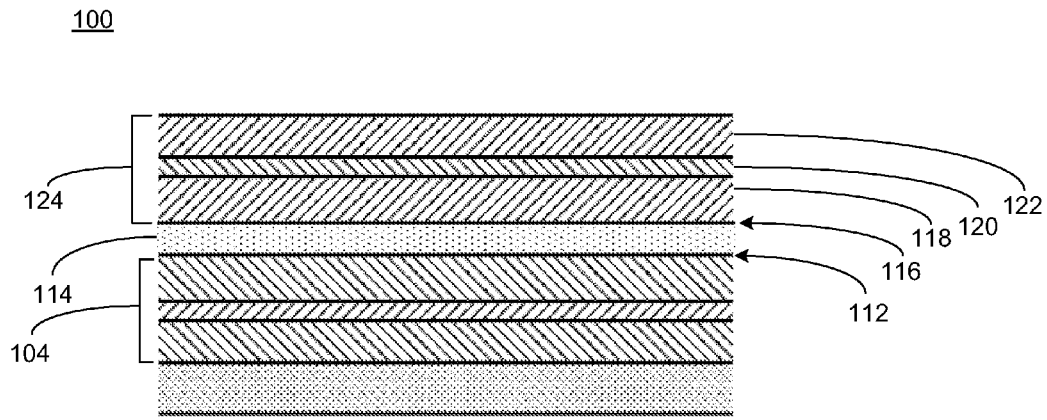
FIG. 1c is a side view of the lighting device die of FIG. 1b further including a second light emitting diode.

Referring now to FIG. 1c, the lighting die 100 of FIG. 1b is depicted having a third semiconductor layer 118 positioned on a surface 116 of the layer of conductive material 114, a second active region 120, and a fourth semiconductor layer 122. The third semiconductor layer 118, the second active region 120, and the fourth semiconductor layer 122 may be configured so as to combine to form a second LED 124. In some embodiments, the third semiconductor layer 118 may be a p-type dopes semiconductor material and the fourth semiconductor layer 122 may be an n-type doped semiconductor layer, or vice-versa. The third semiconductor layer 118 and the fourth semiconductor layer 122 may be formed by any of the methods and composed of any of the material described hereinabove.

The third semiconductor layer 118 may be attached to the surface 116 of the layer of conductive material 114 so as to prevent relative movement therebetween. Moreover, the third semiconductor layer 118 may be coextensive with the periphery of the layer of conductive material 114, extend beyond the periphery of the layer of conductive material 114, or be within the periphery of the layer of conductive material 114.

Each of the first LED 104 and the second LED 124 may be configured to emit lighting within a wavelength range corresponding to a color. More specifically, the first LED 104 may be configured to emit lighting within a first wavelength range corresponding to a first color, and the second LED 124 may be configured to emit light within a wavelength range corresponding to a second color. The first color may be the same as or similar to the second color, or the first color may be different from the second color.

Furthermore, in some embodiments, each of the first LED 104 and the second LED 124 may be configured to control the necessary forward voltage to cause each of the first LED 104 and the second LED 124 to operate. In some embodiments, the forward voltage may be the approximately equal, or it may be different. Moreover, depending on the type of semiconductor material used in forming each of the first semiconductor layer 106, the second semiconductor layer 110, the third semiconductor layer 118, and the fourth semiconductor layer 122, there may be an intended direction of flow of current, such as from the first LED 104 to the second LED 124. In such an embodiment, the anode of the LED with the lower forward voltage requirement may be configured to be in electrical communication with the cathode of the LED with the greater forward voltage requirement. For example, in embodiments where the second semiconductor layer 110 is an n-type semiconductor, the third semiconductor layer 118 may be a p-type semiconductor, thereby enabling the concurrent forward operation of each of the first LED 104 and the second LED 124. The material forming each of the first LED 104 and the second LED 124 may be selected so as to result in the flow of current through the desired series of LEDs.

Additionally, in some embodiments, the layer of conductive material 114 may have a thickness sufficient to prevent the formation of an active region between the second semiconductor layer 110 and the third semiconductor layer. Moreover, the layer of conductive material 114 may be configured so as to enable the flow of current from the first LED 104 to the second LED 124. In some embodiments, the layer of conductive material 114 may be formed of a translucent material, permitting light emitted from either of the first LED 104 and the second LED 124 to propagate therethrough. For example, the layer of conductive material 114 may be formed of a transparent conducting film (TCF), such as, for example, polyethylene terephthalate (PTE), indium tin oxide (ITO), fluorine-doped tin oxide (FTO), doped zinc oxide, carbon nanotube films, grapheme films, poly(3,4-ethylenedioxythiophene) (PEDOT) and its derivatives, and any other conductor that permits the propagation of light therethrough.

Figure 1D:
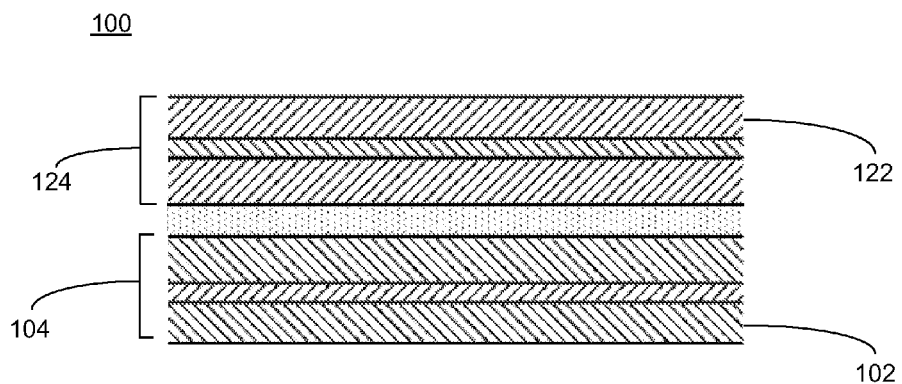
FIG. 1d is a side view of the lighting device die of FIG. 1c wherein the substrate has been removed.

Referring now to FIG. 1d, the lighting die 100 of FIG. 1c is depicted with the substrate having been removed. The removal of the substrate may be accomplished by any suitable means or method, including, but not limited to, laser etching, chemical etching, grinding, cleaving, and all other methods known in the art. Once the substrate has been removed, each of the first semiconductor layer 102 and the fourth semiconductor layer 122 may be attached to a conductive member, such as a wire, and integrated into a circuit. As such, the lighting die 100 may operate as a monolithic lighting device comprising two light sources, namely the first LED 104 and the second LED 124.

Figure 2:
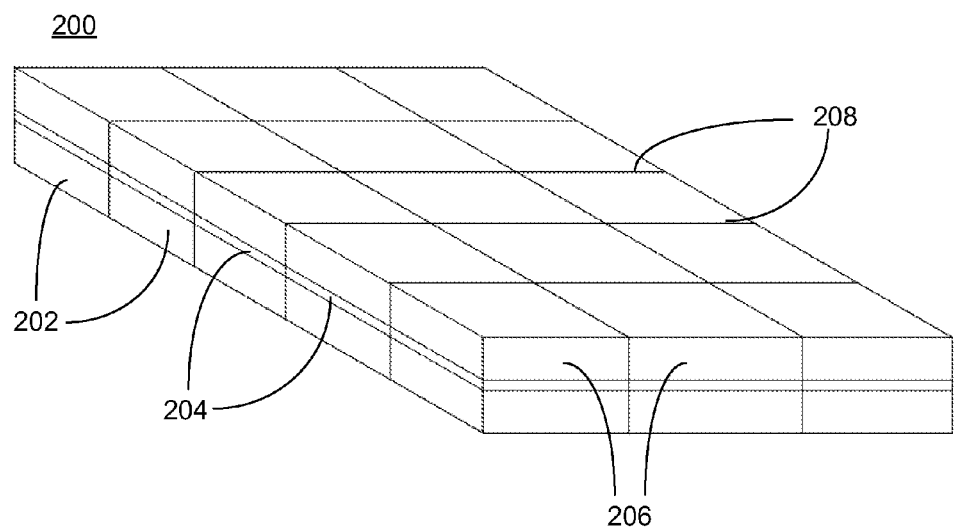
FIG. 2 is a perspective view of the lighting device of FIG. 1d further including a plurality of troughs.

Referring now to FIG. 2, an embodiment of a plurality of lighting dies 200 is depicted. In some embodiments, the plurality of lighting dies 200 may each include a first LED 202, and layer of conductive material 204, and a second LED 206, each of which may be formed as described hereinabove. Furthermore, in some embodiments, the plurality of lighting dies 200 may be formed as a single lighting die substantially has described hereinabove. Once so formed, a plurality of trenches 208 may be formed in the single lighting die so as to form the plurality of lighting dies 200. The plurality of trenches 208 may be formed by any appropriate means or method, including, but not limited to, laser etching, chemical etching, drilling, or any other method known in the art. Each of the plurality of troughs 208 may penetrate through each of the second LED 206, the layer of conductive material 204, and the first LED 202 so as to form discrete monolithic lighting dies as described hereinabove. Each discrete monolithic lighting die may be electrically isolated from each other discrete monolithic lighting die. Moreover, the plurality of troughs 208 may optionally penetrate through a substrate on which the plurality of lighting dies 200 may be formed, resulting in physical separation of each discrete monolithic lighting die. Alternatively, the substrate may be removed separate and apart from the formation of the plurality of troughs 208, so as to simultaneously detach each discrete monolithic lighting die of the plurality of lighting dies 200 from each other, permitting each of the discrete monolithic lighting dies to detach and be removable.

Figure 3:
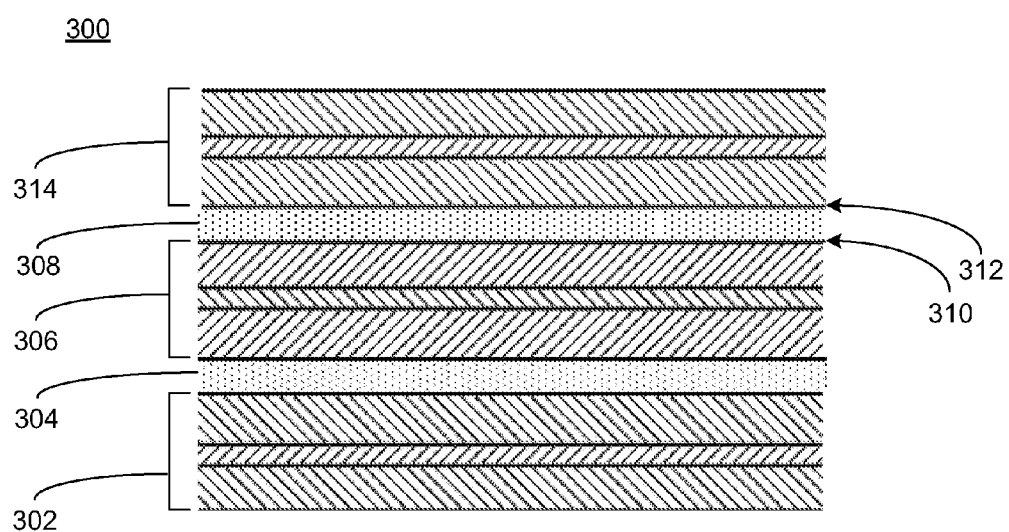
FIG. 3 is a side view of the lighting device die of FIG. 1d further including a second conductive layer and a third light emitting diode.

Referring now to FIG. 3, a side view of a lighting die 300 according to an embodiment of the invention is depicted. The lighting die 300 may be substantially similar to the lighting die 100 depicted in FIG. 1c, including a first LED 302, a first layer of conductive material 304, and a second LED 306, and further including a second layer of conductive material 308 attached to a surface 310 of the second LED 306 similar to the attachment of the first layer conductive material 304 to a surface of the first LED 302 described hereinabove, and a third LED 314 attached to a surface 312 of the second layer of conductive material 308, again similarly attached as described hereinabove. The third LED 314 may be configured similarly to the configuration of each of the first LED 302 and the second LED 306 hereinabove, both in terms of the individual characteristics of the LED and its cooperation with the first LED 302 and the second LED 306. For example, the third LED 314 may have a required forward voltage that is less than the required forward voltage for the second LED 306, which is in turn less than the required forward voltage for the first LED 302. Similarly, the third LED may be configured to emit light within a wavelength range corresponding to a color that is approximately equal to or different from the color of light emitted by each of the first LED 302 and the second LED 304.

It is contemplated that a lighting die may include any number of LEDs with a layer of conductive material positioned in between each pair of LEDs. Accordingly, lighting dies having four LEDs or more are contemplated and included within the scope of the invention. Moreover, the characteristics of each of the LEDs may be substantially as described hereinabove.

Figure 4:
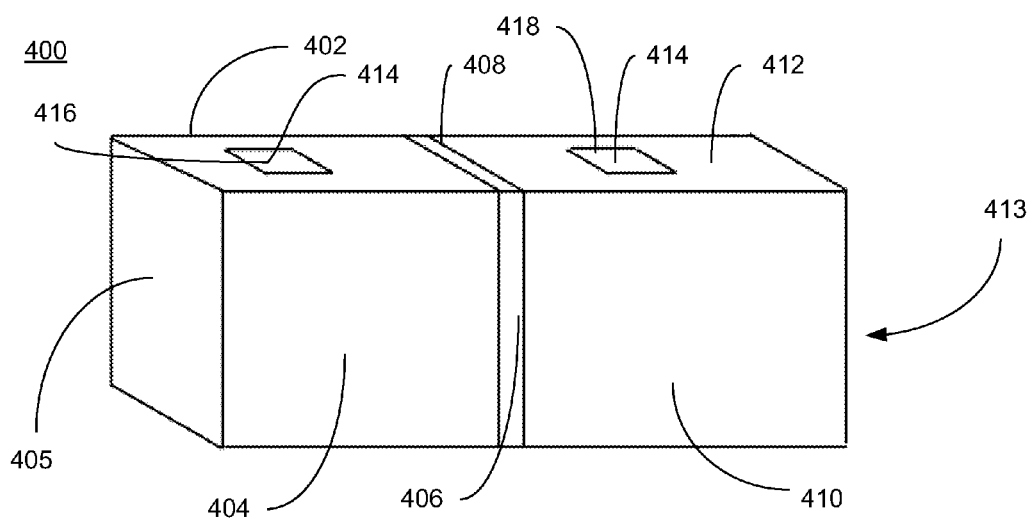
FIG. 4 is a perspective view of a monolithic lighting device according to an embodiment of the invention.

Referring now to FIG. 4, a monolithic lighting device 400 according to an embodiment of the present embodiment is depicted. The monolithic lighting device 400 may include a first LED 402 having a side surface 404 and an end surface 405, a layer of conductive material 406 having a side surface 408, and a second LED 410 also having a side surface 412 and an end surface 413. In the present embodiment, each of the first LED 402, the layer of conductive material 406, and the second LED 410 are formed into a rectangular configuration such that each of their respective side surfaces 404, 408, 412 include four sections. Other configurations are contemplated and included within the scope of the invention, including, but not limited to, circles, ellipses, ovals, triangles, squares, and any other polygon.

In some embodiments, the monolithic lighting device 400 may further include a color conversion layer 414. The color conversion layer 414 may be positioned on any of the side surfaces 404, 408, 412 and any of the end surfaces 405, 413. The color conversion layer 414 may be configured to receive a source light within a first wavelength range and emit a converted light within a second wavelength range. Accordingly, the color conversion layer 414 may be configured to receive lighting within a wavelength range corresponding to the wavelength range of a light source that is in optical communication with the color conversion layer 414. Where the color conversion layer 414 is positioned on the side surface 404 of the first LED 402, it may be considered in optical communication with the first LED 402, and, similarly, a color conversion layer 414 positioned on the side surface 412 of the second LED 410 may be considered in optical communication with the second LED 410. Where the color conversion layer 414 is positioned on the side surface 408 of the layer of conducting material 406, it may be considered in optical communication with each of the first LED 402 and the second LED 410. When the color conversion layer 414 is in optical communication with two or more light sources, it may be configured to receive light within a wavelength range corresponding to all of the wavelength ranges of the source lights emitted by the light sources, or it may be configured to receive light within a wavelength range corresponding to a subset of the wavelength ranges of the source lights emitted by the light sources. For example, where the color conversion layer 414 may be configured to receive source lights within a wavelength range corresponding to a wavelength range of light emitted by the first LED 402, but not the second LED 410, or vice versa, or it may be configured to receive light from both the first LED 402 and the second LED 410. The various permutations of combinations of source lights received by the color conversion layer 414 are contemplated and included within the scope of the invention.

The color conversion layer 414 may be formed of any material capable of receiving a source light within a first wavelength range and emitting a converted light within a second wavelength range. Types of materials include, but are not limited to, phosphors, luminescents, quantum dot materials, and dyes. All other non-recited materials capable of performing such a color conversion are contemplated and included within the scope of the invention.

The color conversion layer 414 may be configured into first and second sections 416, 418, each of the sections 416, 418, being configured to perform a color conversion of light emitted by light sources in optical communication therewith. For example, in the present embodiment, the first section 416 may be positioned in optical communication with the first LED 402 and configured to perform a color conversion on light emitted by the first LED 402. Similarly, the second section 418 may be positioned in optical communication with the second LED 410 and configured to perform a color conversion on light emitted by the second LED 410. Moreover, the first section 416 may be configured to not perform a color conversion on light emitted by the first LED 402, and the second section 418 may be configured to not perform a color conversion on light emitted by the second LED 410. The color conversion layer 414 comprising two sections is exemplary only, and any number of sections is contemplated and included within the scope of the invention.

Additionally, the color conversion layer 414 may be configured to have an emission latency. In some embodiments, an emission latency may be thought of as a period of time that elapses between the color conversion layer 414 receiving a source light and emitting a converted light. The color conversion layer 414 may be configured to have an emission latency designed to reduce or eliminate flicker. In some embodiments, flicker may be thought of as the perceptible variation of luminous intensity of light emitted by the monolithic lighting device. Flicker may be periodic or aperiodic.

Where the monolithic lighting device 400 is electrically coupled with a power source having a varying voltage, one of the first LED 402, the second LED 410, or both, may emit light responsive to the variance of the voltage. For example, where the monolithic lighting device 400 is electrically coupled to an alternating current (AC) power supply, when the voltage supplied by the AC power supply falls below a certain voltage, one of the first LED 402 and the second LED 410, or both, may cease to emit light. When the voltage supplied by the AC power supply rises above a certain voltage, first LED 402 and/or the second LED 410 may resume emitting light. The period that elapses between the first LED 402 and/or the second LED 410 ceasing and then resuming emitting light may be perceptible, and hence may be considered flicker. The color conversion layer 414 may be configured to include an emission latency such that when the color conversion layer 414 receives light from one or both of the first LED 402 and the second LED 410, a period of time may elapse before the color conversion layer 414 emits converted light. Where the period of the AC power supply is predictable, the emission latency of the color conversion layer 414 may be configured to by asynchronous with the period of non-emission of one or both of the first LED 402 and the second LED 410. Put another way, the emission latency of the color conversion layer 414 may be configured to prevent any noticeable decrease in the luminous intensity of light emitted by the monolithic lighting device 400. For example, the emission latency may be configured to be asynchronous with a power supply having a frequency within the range of about 1 Hz to about 240 Hz, including about 50 Hz, about 60 Hz, about 100 Hz, and about 120 Hz. Additionally, the emission latency may be configured to be asynchronous with a polyphase frequency.

Figure 5:
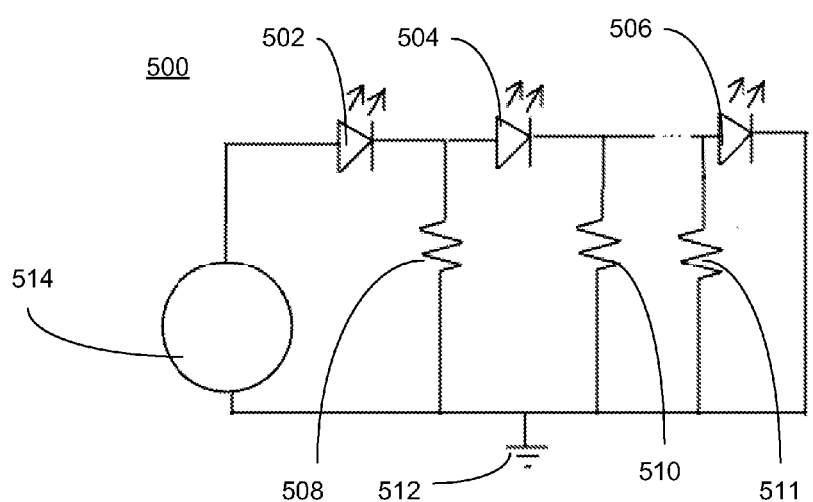
FIG. 5 is a schematic circuit diagram of a lighting device according to an embodiment of the present invention.

Referring now to FIG. 5, a schematic circuit diagram of a lighting device 500 according to an embodiment of the present invention is depicted. The lighting device 500 may include a first LED 502, a second LED 504, and an Nth LED 506 electrically coupled to each other in a series configuration, wherein the Nth LED 506 may be the last of any number of LEDs coupled in series, forming a plurality of serially connected LEDs. The lighting device 500 may further include a first resistor 508, a second resistor 510, and an Nth resistor 511. The first resistor 508 may be electrically coupled at a first end to a node formed between a cathode of the first LED 502 and an anode of the second LED 504, and at a second end to a ground 512. The ground 512 may be included as part of the lighting device 500 or it may be an external element. Similarly, the second resistor 510 may be electrically coupled at a first end to a node formed between a cathode of the second LED 504 and an anode of the next serially coupled LED, for instance, the Nth LED 506, and the Nth resistor 511 may be electrically coupled at a first end to a node formed between an anode of the Nth LED 506 and a cathode of a preceding LED in the plurality of serially connected LEDs, for instance, the second LED 504. Furthermore, an anode of the first LED 502 may be electrically coupled to a power supply 514. Similar to the ground 512, the power supply 514 may be included as part of the lighting device 500 or it may be an external element. Also, a cathode of the Nth LED 506 may be electrically coupled to the ground 512. The lighting device 500 may include any number of serially connected LEDs and associated resistors.

Each of the serially coupled LEDs 502, 504, 506 may have a known required forward voltage, which may be understood as the voltage that is required for the LED to operate, and a known forward voltage drop, which may be understood as a drop in voltage across the LED when the LED is emitting light. Each of the first LED 502, the second LED 504, and the Nth LED 506 may be arranged such that the first LED 502 has the greatest required forward voltage, the second LED 504 have a required forward voltage that is less than or approximately equal to the required forward voltage of the first LED 502, and the Nth LED 506 have a required forward voltage that is less than or approximately equal to the preceding LED in the serially connected LEDs, for instance the second LED 504. Accordingly, when a voltage applied by the power supply 514 to the anode of the first LED 502 is approximately equal to or greater than the required forward voltage of the first LED 502, the first LED 502 will operate to emit light, and current will flow through the first LED 502. Accordingly, a voltage will be applied to the anode of the second LED 504. However, the voltage will be approximately the voltage applied to the anode of the first LED 502 less the forward voltage drop of the first LED 502. If the voltage applied to the anode of the second LED 504 is greater than the required forward voltage of the second LED 504, the second LED will operate to emit light and current will flow therethrough. However, if the voltage applied to the anode is less than the required forward voltage of the second LED 504, the second LED 504 will prevent the flow of current therethrough, and current will instead flow through the first resistor 508. Accordingly, where the voltage of current flowing from the cathode of the first LED 502 is greater than or approximately equal to the required forward voltage of the second LED 504, both the first LED 502 and the second LED 504 will operate to emit light, but if it is less than the required forward voltage of the second LED 504, then only the first LED 502 will operate to emit light. Moreover, the first resistor 508 may be configured to have a resistance such that when the voltage applied to the anode of the second LED 504 is greater than its required forward voltage, very little current flows through the first resistor 508. This sequence will continue down the plurality of serially connected LEDs, wherein an LED succeeding the second LED 504, for instance, the Nth LED 506, will have a voltage applied to its anode of the second LED 504 operates and has current flowing therethrough. Similar to the first resistor 508, each of the second resistor 510 and the Nth resistor 511 may be configured to have a resistance to permit very little current to flow therethrough when the voltage applied to the associated LED anode is greater than or approximately equal to that LED's required forward voltage. The voltage applied may be approximately the voltage applied to the anode of the first LED 502 less the forward voltage drop of each of the first LED 502 and the second LED 504. If the voltage applied to the anode of the Nth LED 506 is greater than or approximately equal to the required forward voltage of the Nth LED 506, then it will operate, along with the first LED 502 and the second LED 504. However, if the voltage applied to the anode of the Nth LED 506 is less than the required forward voltage, then current will instead flow through the Nth resistor 511. Where the Nth LED 506 is the last serially connected LED, if the voltage applied to its anode is greater than its required forward voltage, current will flow therethrough and to the ground 512.

Where the power source 514 provides power having a varying voltage, the number of LEDs of the plurality of serially connected LEDs will similarly vary. For instance, where the power source 514 is an AC power source having a frequency with associated phases defining the voltage supplied, when the power supply 514 provides power having a voltage greater than the required forward voltage of the first LED 502 but less than the required voltage of the first LED 502 in addition to the forward voltage drop of the first LED 502, only the first LED 502 will illuminate. When the power supply 514 is in a later phase supplying an increased voltage, the voltage may be sufficient to illuminate more than the first LED 502 of the plurality of serially connected LEDs, such as, for instance, the second LED 504, and the Nth LED 506. The power supplied by the power supply 514 may be configured according to the required forward voltage of the Nth LED 506 as well as the forward voltage drop of all the LEDs preceding the Nth LED 506. Moreover, the number of LEDs in the plurality of serially connected LEDs may be configured such that all the LEDs of the plurality of LEDs will be illuminated when the power supply 514 provides its maximum voltage. Where the power supply 514 is an AC power supply, it may be rectified, including half-wave and full wave. Moreover, the power supply 514 may be a triac power supply.

It is contemplated that the plurality of serially connected LEDs may be configured to emit light within a wavelength range associated by one color, or within a plurality of wavelength ranges corresponding to a variety of colors. Additionally, it is contemplated that one or more of the plurality of serially connected LEDs may include a color conversion layer. Moreover, where an LED comprises a color conversion layer, the color conversion layer may include an emission latency. The emission latency may be configured as described hereinabove.

The luminous intensity of the lighting device 500 may be thought of as the cumulative luminous intensity of the plurality of LEDs that are emitting light at a given point in time. Accordingly, where the power supply 514 is an AC power supply, the luminous intensity of the lighting device 500 will vary according to the number of LEDs that are emitting light at a given point in time. In order to prevent flicker, one or more of the plurality of serially connected LEDs may include a color conversion layer with an emission latency that is asynchronous with the frequency of the AC power supply, substantially as described hereinabove. Moreover, the lighting device 500 optionally include a color conversion layer that is remote from any of the plurality of serially connected LEDs, as will be discussed hereinbelow.

Figure 6:
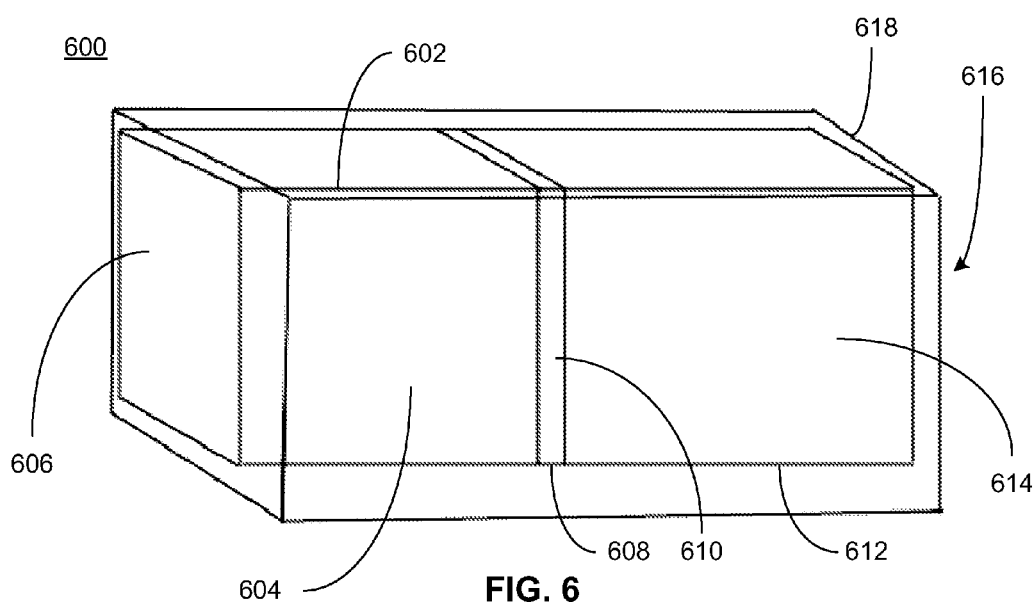
FIG. 6 is a perspective view of a monolithic lighting device according to an embodiment of the invention.

Referring now to FIG. 6, a monolithic lighting device 600 according to an embodiment of the present invention is depicted. The monolithic lighting device 600 may include a first LED 602 having a side surface 604 and an end surface 606, a layer of conductive material 608 having a side surface 610, and a second LED 612 having a side surface 614 and an end surface 616. The monolithic lighting device 600 may further comprise an encapsulating layer 618 positioned substantially about the side surfaces 604, 610, and 614 and/or the end surfaces 606 and 616. The encapsulating layer 618 may be configured to permit electrical connectors to pass therethrough, permitting the electrical coupling of the monolithic lighting device 600 to a power supply.

In some embodiments, the encapsulating layer 618 may be at least partially formed of a transparent material, permitting the propagation of light therethrough. In some other embodiments, the encapsulating layer 618 may be formed at least partially of a heat-conducting material. Furthermore, the encapsulating layer 618 may be in thermal communication with at least one of the first LED 602, the layer of conductive material 608, and the second LED 612. The encapsulating layer 618 may be configured to dissipate heat from any element of the monolithic lighting device 600 with which it is in thermal communication by conducting heat away from heat-generating elements and radiating heat into the environment surrounding the monolithic lighting device 600. Moreover, in some other embodiments, the encapsulating layer 618 may be in thermal communication with another structure to further increase the rate of heat dissipation of the monolithic lighting device 600.

Additionally, in some embodiments, the encapsulating layer 618 may be configured to include or function as a color conversion layer as described hereinabove.

Figure 7:
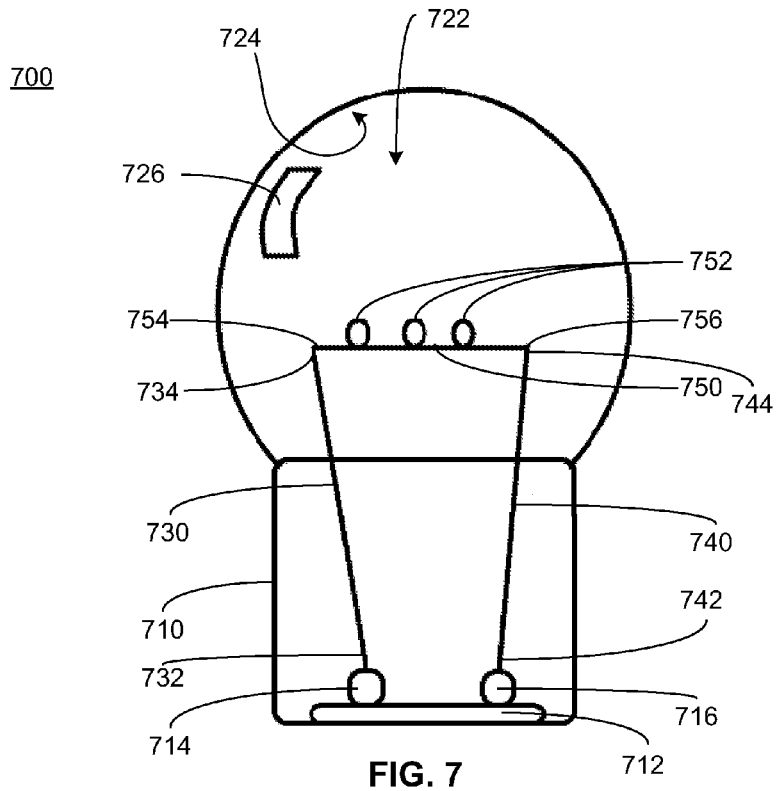
FIG. 7 is a side view of a luminaire according to an embodiment of the present invention.

Referring now to FIG. 7, a luminaire 700 according to an embodiment of the present invention is presented. The luminaire 700 may include a base 710, an optic 720, a first support 730, a second support 740, and a light source 750. The luminaire 700 may be formed so as to conform to standardized dimensional requirements, such as, for example, light bulb standards A, B, G, MR, PAR, F, P, R, ER, IRC, and any other standard known in the art. Additionally, the base 710 may be configured to conform to standardized base configurations, including, for example, Edison screw, bi-pin, bi-post, wedge, bayonet, fluorescent base, and any other configuration known in the art. Moreover, the base 710 may include an electrical connector 712 configured to couple electrically with a power source.

The optic 720 may be attached to the base 710 so as to define an optical chamber 722. The first support 730 may be attached at a first end 732 to the electrical connector 712. More specifically, the first end 732 of the first support 730 may be attached to a positive terminal 714 of the electrical connector 712. Similarly, the second support 740 may be attached at a first end 742 to a negative terminal 716 of the electrical connector 710. Each of the first support 730 and the second support 740 may be configured to be electrically conductive along their length. Also, each of the first support 730 and the second support 740 may extend from the electrical connector 710 into the optical chamber 722, diverging from each other.

In some embodiments, the light source 750 may include a plurality of serially connected LEDs 752, such as in a monolithic lighting device as described hereinabove. Accordingly, the light source 750 may have a positive end 754 corresponding to the anode of the first LED of the plurality of serially connected LEDs 752, and a negative end 756 corresponding to at least one of the cathode of the last LED of the plurality of serially connected LEDs 752 and one or more of a plurality of resistors electrically coupled to nodes between pairs of LEDs, substantially as described hereinabove, or both. The positive end 754 may be attached and electrically coupled to a second end 734 of the first support 730, and the negative end 756 may be attached and electrically coupled to a second end 744 of the second support 740. Accordingly, the positive end 754 may be positioned in electrical communication with the positive terminal 714 of the electrical connector 712, and the negative end may be positioned in electrical communication with the negative terminal 716 of the electrical connector 712. Furthermore, the light source 750 may be carried by the first support 730 and the second support 740 such that it is suspended within the optical chamber 722.

When current is received from a power supply through the electrical connector 712, the current may travel through the positive terminal 714 to the first support 730 and to the positive end 754 of the light source 750. The current may then travel through the plurality of serially connected LEDs 752 substantially as described in the various embodiments presented hereinabove. Light emitted by the light source 750 may propagate through the optical chamber 722 and through the optic 720, then into the environment surrounding the luminaire 700. The current may illuminate some, all, or none of the plurality of LEDs 752 before flowing to the negative end 756 of the light source 750, then through the second support 740 and to the negative terminal 716 of the electrical connector 712. Hence, a circuit is formed between the luminaire 700 and the power supply. The luminous intensity of light emitted by the light source 750, and hence the luminaire 700, may vary according to the voltage supplied to the luminaire 700 by the power supply.

In some embodiments, the light source 750 may include a color conversion layer positioned on one or more of the plurality of serially connected LEDs 752 as described hereinabove. In some embodiments, the light source 750 may include an encapsulating layer of material disposed substantially about the light source 750. The encapsulating layer may be an encapsulating layer as described hereinabove, and may optically be in thermal communication with heat-generating elements of the light source 750. Furthermore, the encapsulating layer may be in thermal communication with one or both of the first support 730 and the second support 740, which may serve to further increase the rate of heat dissipation from the light source 750.

In some embodiments, the optic 720 may further include an inside surface 724. Furthermore, a color conversion layer 726 may be attached to the inside surface 724. The color conversion layer 726 may include the various features as described hereinabove, including a configured emission latency configured to be asynchronous with a frequency of the power supply.

Figure 8:
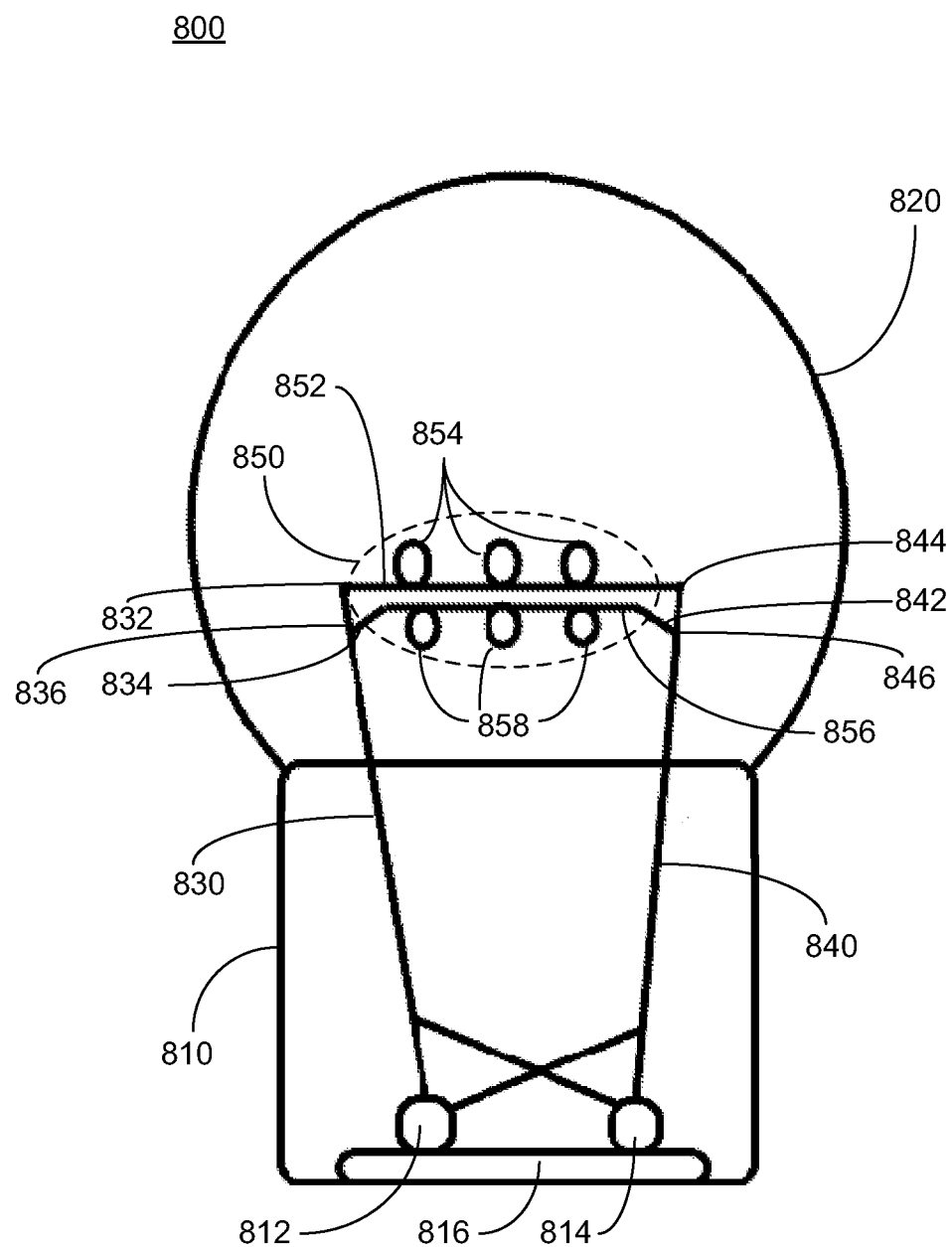
FIG. 8 is a side view of a luminaire according to another embodiment of the present invention.

Referring now to FIG. 8, a luminaire 800 according to an embodiment of the present invention is depicted. The luminaire 800 may be similar to the luminaire 700 as depicted in FIG. 7, including a base 810, an optic 820, a first support 830, a second support 840, and a light source 850. However, each of the first support 830 and the second support 840 may be electrically coupled with both of a positive terminal 812 and a negative terminal 814 of an electrical connector 816 of the base 810. Each may include a positive terminal 832, 842 and a negative terminal 834, 844 at an end 836, 846.

The light source 850 may include a first monolithic lighting device 852 comprising a plurality of serially connected LEDs 854 and a second monolithic lighting device 856 comprising a plurality of serially connected LEDs 858. The first monolithic lighting device 852 may be attached to the positive terminal 832 of the first support 830 and the negative terminal 844 of the second support 840 such that when current flows through the forward operation of the plurality of LEDs 854 occurs when current flows through the first monolithic lighting device 852 from the positive terminal 832 to the negative terminal 844. Similarly, the second monolithic lighting device 856 may be attached to the positive terminal 842 of the second support 840 and the negative terminal 834 of the first support 830 such that when current flows through the forward operation of the plurality of LEDs 858 occurs when current flows through the second monolithic lighting device 856 from the positive terminal 842 to the negative terminal 834. Accordingly, the first monolithic lighting device 852 may be in a generally opposite orientation compared to the second monolithic lighting device 856.

When the electrical connector 816 is positioned in electrical communication with a power source, current from the power source may flow the positive terminal 812 to the positive terminals 832, 842 of each of the first support 830 and the second support 840. From there, the current may flow through each of the first monolithic lighting device 852 and the second monolithic lighting device 856, illuminating LEDs substantially as described for the light source 750 described in FIG. 7. Due to their generally opposite orientation, each of the plurality of LEDs 854, 858 will illuminate in generally opposite order. Put another way, the plurality of LEDs 854 will illuminate from the first support 830 toward the second support 840, and the plurality of LEDs 858 will illuminate from the second support 840 toward the first support 830.

In some embodiments, one or both of the first and second monolithic lighting devices 852, 856 may include a color conversion layer or an encapsulating layer, substantially as described in the embodiment depicted in FIG. 7. Additionally, in some embodiments, the optic 820 may include a color conversion layer, also substantially as described in the embodiment depicted in FIG. 7.

In another embodiment of the invention, a method of fabricating a lighting device is presented. The method may include the step of first providing a substrate having a surface. A masking layer may then be selectively deposited on a first section of the surface of the substrate. A first LED may then be formed on a second section of the substrate and a second LED may be formed on a third section of the substrate, by any method disclosed hereinabove. Each of the second section and the third section may be adjacent with the first section, such that the first section is intermediate the second and third sections. The method may further include removing the mask by any appropriate means, such as etching, drilling, or chemical bath. A conductive trace may then be deposited on the first section of the surface of the substrate so as to couple electrically the first LED and the second LED by any method disclosed hereinabove. This process may be extended to any number of LEDs and intermediate electrical traces, producing a plurality of serially connected LEDs. Moreover, the plurality of serially connected LEDs may be generally collinear. The method may optionally include the step of removing the substrate.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus the scope of the invention should be determined by the appended claims and their legal equivalents, and not by the examples given.

What is claimed is:

1. A method of fabricating a lighting device comprising the steps of:
   providing a substrate having a surface;
   forming a substantially planar first LED on the surface of the substrate, the first LED having a surface;
   attaching a substantially planar first layer of conductive material on the surface of the first LED, the conductive material having a surface;
   forming a substantially planar second LED on the surface of the conductive material;
   etching a plurality of troughs through each of the second LED, the first layer of conductive material, and the first LED; and
   removing the substrate.

2. A method according to claim 1 wherein at least one of first LED, the second LED, and the layer of conductive material comprises a transparent material.

3. A method according to claim 1 wherein each of the first LED and second LED comprises a side surface, the method further comprising the step of attaching a color conversion layer to the side surface of at least one of the first LED and the second LED.

4. A method according to claim 1 wherein the plurality of troughs are configured in a grid pattern.

5. A method according to claim 1 wherein the second LED comprises a surface, further comprising the steps of:
   attaching a second layer of conductive material to the surface of the second LED, the second layer of conductive material having a surface; and
   forming a third LED on the surface of the second layer of conductive material.

6. A method according to claim 1 wherein at least one of the first LED and the second LED are formed by metalorganic chemical vapor deposition (MOCVD).

7. A method according to claim 1 wherein the first layer of conductive material is attached to the surface of the first LED by ink jet material deposition.

8. A method according to claim 1 wherein the first LED is configured to emit a first color and wherein the second LED is configured to emit a second color.

9. A method according to claim 1 wherein the step of removing the substrate results in the formation of a monolithic lighting device, the method further comprising the step of encapsulating the monolithic lighting device with a clear material.

10. A method according to claim 9 wherein the clear material is heat-conducting.

* * * * *